(12) United States Patent
Sekiya (10) Patent No.: US 11,651,978 B2
(45) Date of Patent: May 16, 2023

(54) PROTECTIVE SHEET APPLICATION APPARATUS AND METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 313 days.

(21) Appl. No.: 17/126,425

(22) Filed: Dec. 18, 2020

(65) Prior Publication Data

US 2021/0197537 A1 Jul. 1, 2021

(30) Foreign Application Priority Data

Dec. 27, 2019 (JP) .............................. JP2019-239415

(51) Int. Cl.
*H01L 21/67* (2006.01)
*B32B 27/32* (2006.01)
*H01L 21/00* (2006.01)

(52) U.S. Cl.
CPC ........ *H01L 21/67132* (2013.01); *B32B 27/32* (2013.01); *H01L 21/00* (2013.01); *B32B 2457/14* (2013.01)

(58) Field of Classification Search
CPC ............... H01L 21/67132; H01L 21/00; H01L 21/6835; H01L 21/67253; H01L 2221/68327; H01L 2221/6834; H01L 2221/68381; H01L 21/67103; H01L 21/6836; B32B 27/32; B32B 2457/14; B32B 3/30; B32B 9/005; B32B 9/045; B32B 17/10; B32B 27/06; B32B 2250/02; B32B 27/302; B32B 27/36; B32B 7/02; C09J 7/241; C09J 7/255; C09J 2203/326
See application file for complete search history.

(56) References Cited

U.S. PATENT DOCUMENTS

| | | | | |
|---|---|---|---|---|
| 7,629,231 | B2 * | 12/2009 | Maki | ........................ H01L 24/83 |
| | | | | 438/464 |
| 8,080,121 | B2 * | 12/2011 | Inao | ........................... C09J 5/04 |
| | | | | 156/154 |
| 2021/0249286 | A1 * | 8/2021 | Priewasser | .............. B32B 38/18 |

FOREIGN PATENT DOCUMENTS

| | | | |
|---|---|---|---|
| JP | 2005123382 A | 5/2005 | |
| JP | 2013239564 A | 11/2013 | |

* cited by examiner

*Primary Examiner* — Yasser A Abdelaziez
(74) *Attorney, Agent, or Firm* — Greer Burns & Crain Ltd.

(57) ABSTRACT

A protective sheet application method for applying a protective sheet on a front surface of a substrate includes mounting the substrate on a support table in a vacuum chamber, mounting the protective sheet on the substrate to separate a space in the vacuum chamber into a first compartment and a second compartment, depressurizing the first compartment to a predetermined air pressure and also depressurizing the second compartment, opening the depressurized second compartment to the atmosphere to bring the protective sheet into close contact with the substrate by a predetermined force, and opening the depressurized first compartment to the atmosphere to separate the lower housing and the upper housing from each other. A protective sheet application apparatus for applying the protective sheet on the front surface of the substrate includes the vacuum chamber.

6 Claims, 6 Drawing Sheets

PROTECTIVE SHEET APPLICATION APPARATUS AND METHOD

BACKGROUND OF THE INVENTION

Field of the Invention

The present invention relates to a protective sheet application apparatus and a protective sheet application method for applying a protective sheet on a front surface of a substrate having irregularities on the front surface.

Description of the Related Art

Devices chips for use in electronic equipment such as mobile phones and computers are formed by grinding and thinning a substrate on which a plurality of devices are arranged side by side, from a side of a back surface thereof, and dividing the substrate on a device-by-device basis. The grinding of the substrate is performed by a grinding apparatus. In the grinding apparatus, the substrate is held by a chuck table with the side of the back surface exposed upward, and a grinding stone that is traveling on an annular track is brought into contact with the side of the back surface of the substrate to grind the substrate. At this time, a protective tape in which a base material layer and an adhesive layer are laminated together is bonded beforehand to the front surface of the substrate to protect the substrate on a side of the front surface thereof.

On the side of the front surface of the substrate, patterns or the like which define devices and interconnects are arranged. On the side of the front surface of the substrate, bumps may also be formed beforehand as electrodes for the devices. By a variety of patterns, bumps, and the like, irregularities are hence formed on the front surface of the substrate. If there are substantial height differences in the irregularities on the front surface of the substrate, use of a protective tape having a thick adhesive layer may be considered such that the irregularities on the front surface of the substrate can be sufficiently absorbed. In this case, however, residues of the adhesive layer are prone to remain on the irregularities when peeling the protective tape from the substrate, thereby causing failures of device chips.

There have therefore been developed protective tapes having an adhesive layer only at a region corresponding to an outer peripheral surplus region in an outer peripheral portion of a substrate where no devices are formed and having no adhesive layer at a region corresponding to a device-forming region of the substrate where devices are formed (see, for example, JP 2005-123382A and JP 2013-239564A). With such a protective tape, however, a wide region remains unbonded to a substrate, thereby leaving a problem that its fixing to the substrate is unstable.

SUMMARY OF THE INVENTION

A method may hence be considered to apply a protective sheet made of a resin and having no adhesive layer on a substrate, in place of a protective tape having an adhesive layer. If such a protective sheet is placed on a front surface of a substrate having irregularities on the front surface thereof and the protective sheet is heated and softened and is then brought into close contact with the irregularities on the front surface of the substrate, the protective sheet can be fixed on the front surface of the substrate. As the protective sheet is fixed on the front surface of the substrate in a wide region thereof, its fixing to the substrate does not become unstable. In addition, no residues of an adhesive layer remain on the substrate after peeling off the protective sheet from the substrate because the protective sheet has no adhesive layer. If the protective sheet is firmly in close contact with the front surface of the substrate, however, a problem arises in that bumps arranged on the front surface of the substrate are also stripped off together with the protective sheet from the substrate when the protective sheet is peeled off from the substrate. If the contact force of the protective sheet to the front surface of the substrate is weak, on the other hand, another problem arises in that grinding water and grinding debris penetrate between the protective sheet and the substrate. It is well-known in this field of art that, while grinding a substrate or the like, grinding water is supplied to the substrate and the like, and grinding debris occurs from the substrate and the like.

The present invention therefore has, as objects thereof, the provision of a protective sheet application apparatus and a protective sheet application method which control the close-contact force of a protective sheet to a substrate to enable appropriate application of the protective sheet on the substrate.

In accordance with a first aspect of the present invention, there is provided a protective sheet application apparatus for applying a protective sheet on a front surface of a substrate having irregularities on a side of the front surface. The protective sheet application apparatus includes a vacuum chamber separable into an upper housing and a lower housing, a support table disposed inside the lower housing and configured to mount the substrate thereon, a first depressurization unit connected to the lower housing, a first open-to-atmosphere unit connected to the lower housing, a second depressurization unit connected to the upper housing, and a second open-to-atmosphere unit connected to the upper housing. The first depressurization unit is configured to depressurize a first compartment in the vacuum chamber to a predetermined air pressure, the first compartment being surrounded by the protective sheet and the lower housing, the protective sheet being placed on the substrate mounted on the support table and being held between the upper housing and the lower housing. The second depressurization unit is configured to depressurize a second compartment in the vacuum chamber, the second compartment being surrounded by the protective sheet and the upper housing, the protective sheet being placed on the substrate mounted on the support table and being held between the upper housing and the lower housing. The second open-to-atmosphere unit opens the depressurized second compartment to the atmosphere, so that the protective sheet can be brought into close contact with the front surface of the substrate by a predetermined force. After opening the second compartment to the atmosphere by the second open-to-atmosphere unit, the first open-to-atmosphere unit opens the first compartment to the atmosphere to separate the upper housing and the lower housing of the vacuum chamber from each other, so that the substrate with the protective sheet kept in close contact therewith can be unloaded from the vacuum chamber.

Preferably, the protective sheet application apparatus may further include a protective sheet supporting portion configured to support the protective sheet that is placed on the substrate mounted on the support table, at a periphery of the support table.

Also, preferably, the protective sheet application apparatus may further include a heating unit configured to heat one of or both the protective sheet and the substrate.

In accordance with a second aspect of the present invention, there is also provided a protective sheet application method for applying a protective sheet on a front surface of a substrate having irregularities on a side of the front surface. The protective sheet application method includes a substrate mounting step of mounting, in a vacuum chamber that is separable into an upper housing and a lower housing and includes a support table disposed inside the lower housing and configured to mount the substrate thereon, a first depressurization unit and a first open-to-atmosphere unit connected to the lower housing, and a second depressurization unit and a second open-to-atmosphere unit connected to the upper housing, the substrate onto the support table with the front surface directed upward in a state that the lower housing and the upper housing are separated from each other, a space separation step of placing the protective sheet on the substrate and the lower housing with the protective sheet opposing the front surface of the substrate mounted on the support table, and unifying the lower housing and the upper housing with the protective sheet held between the lower housing and the upper housing, so that a space in the vacuum chamber is separated into a first compartment surrounded by the lower housing and the protective sheet and a second compartment surrounded by the upper housing and the protective sheet, a depressurization step of depressurizing the first compartment to a predetermined air pressure by the first depressurization unit and depressurizing the second compartment by the second depressurization unit, a protective sheet close-contacting step of opening the depressurized second compartment to the atmosphere by the second open-to-atmosphere unit to bring the protective sheet into close contact with the substrate by a predetermined force such that the substrate follows the irregularities of the front surface of the substrate, and a substrate unloading step of, after the protective sheet close-contacting step, opening the pressurized first compartment to the atmosphere by the first open-to-atmosphere unit to separate the lower housing and the upper housing from each other, and unloading the substrate with the protective sheet kept in close contact therewith from the vacuum chamber.

Preferably, the protective sheet may be a resin sheet containing a polyolefin, polystyrene, or a polyester.

Also, preferably, the protective sheet application method may further include, after the space separation step but before the substrate unloading step, a heating step of heating one of or both the protective sheet and the substrate.

In the protective sheet application apparatus and method according to the first and second aspects of the present invention, the substrate is mounted on the support table disposed inside the vacuum chamber, and the protective sheet is placed on the substrate. The first compartment on a lower side of the protective sheet and the second compartment on an upper side of the protective sheet are then depressurized. The second compartment is subsequently opened to the atmosphere to bring the protective sheet into close contact with the substrate. Here, the degree of close-contact force between the protective sheet and the substrate is determined by the magnitude of a force under which the protective sheet is pressed against the substrate when opened to the atmosphere. The magnitude of this force is determined by the air pressure in the depressurized first compartment. Accordingly, the close-contact force between the protective sheet and the substrate can be controlled to a desired level by adjusting the air pressure in the first compartment that is depressurized by the first depressurization unit.

To prevent, for example, bumps from being stripped off together with the protective sheet which is in close contact with the front surface of the substrate having the bumps arranged on the front surface thereof, when peeling off the protective sheet from the substrate, the close-contact force between the protective sheet and the substrate can also be controlled. Also, to prevent grinding water and machining debris from penetrating between the protective sheet and the substrate while the substrate is ground, the close-contact force between the protective sheet and the substrate can also be controlled.

In accordance with the first and second aspects of the present invention, there are hence provided the protective sheet application apparatus and method which can control the contact force of the protective sheet to the substrate to appropriately apply the protective sheet on the substrate.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
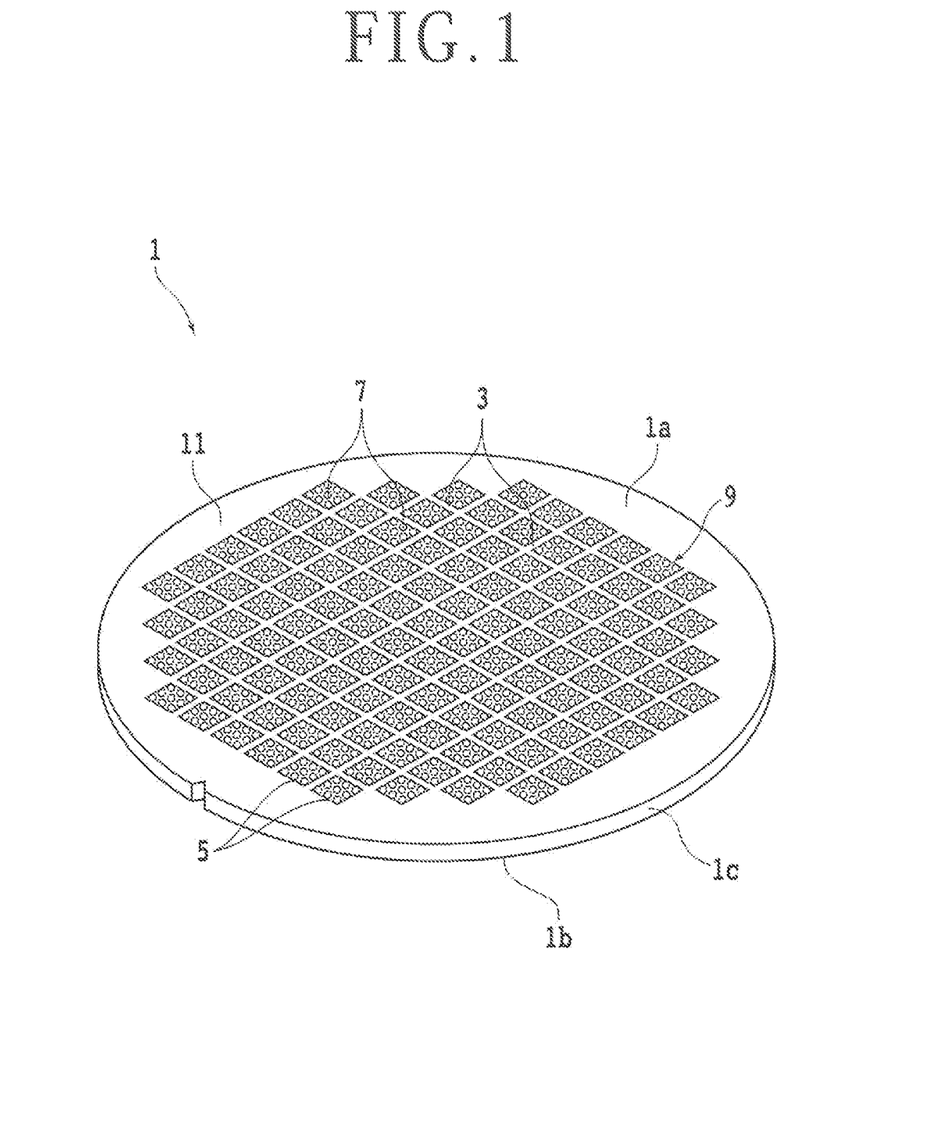
FIG. 1 is a perspective view schematically illustrating a substrate.

With reference to the attached drawings, a description will be made about an embodiment of a first aspect of the present invention and an embodiment of a second aspect of the present invention. In a protective sheet application apparatus and a protective sheet application method according to the respective embodiments, a protective sheet is applied on a front surface of a substrate, such as a semiconductor wafer, with a plurality of devices formed on the front surface. A description will first be made about the substrate on the front surface of which the protective sheet is applied. FIG. 1 is a perspective view schematically illustrating a substrate 1. FIGS. 2B to 4B contain the substrate 1 schematically presented in cross-section. In each of FIGS. 5A and 5B, a portion of the substrate 1, which is located on a side of a front surface 1a of the substrate 1, is schematically presented on an enlarged scale in cross-section.

The substrate 1 is a wafer formed from a material such as silicon (Si), silicon carbide (SiC), gallium nitride (GaN), gallium arsenide (GaAs), or any other semiconductor. As an alternative, the substrate 1 is a substantially disc-shaped substrate or the like formed from a material such as sapphire, glass, or quartz. The glass may be, for example, alkali glass, alkali-free glass, soda-lime glass, lead glass, borosilicate glass, quartz glass, or the like. On the front surface 1a of the substrate 1, a plurality of mutually intersecting scheduled division lines 3 are set. In individual regions defined by the scheduled division lines 3, devices 5 such as integrated circuits (ICs) or large scale integrations (LSIs) are formed. When the substrate 1 is ground and thinned from a side of a back surface 1b and is then divided along the scheduled division lines 3, individual device chips can be formed.

On the front surface 1a of the substrate 1, a plurality of protuberances formed with a metal and called "bumps 7" are arranged. The bumps 7 are electrically connected to the respective devices 5, and when the substrate 1 is divided and the device chips are formed, the bumps 7 function as electrodes when inputting and outputting electrical signals to and from the devices 5. The bumps 7 are formed with a metal material such as gold, silver, copper, or aluminum. However, the bumps 7 may not necessarily be arranged on the front surface 1a of the substrate 1.

A region of the front surface 1a of the substrate 1, the region being located on a side of an outer periphery surrounding a region where the devices 5 are formed, is called "an outer peripheral surplus region 11." In the outer peripheral surplus region 11 of the front surface 1a of the substrate 1, the devices 5 are not formed, and the bumps 7 as the electrodes for the devices 5 are not formed either. The region on the front surface 1a of the substrate 1, the region being surrounded by the outer peripheral surplus region 11, is called "a device forming region 9." The device forming region 9 on the front surface 1a of the substrate 1 is not planar and has irregularities relating to the individual patterns and bumps 7 that form the devices 5.

The substrate 1 on which the protective sheet is to be applied is not limited to the above-described one. For example, the substrate 1 may be a package substrate formed by sealing, with a sealing resin, a plurality of devices arranged side by side in a planar configuration. If the sealing resin on a side of a back surface of the package substrate is ground to thin the package substrate and this package substrate is divided on a device-by-device basis, individual device chips sealed in the sealing resin can be formed with a predetermined thickness. Because bumps are formed, as electrodes for the individual devices, on a front surface of the package substrate, the front surface of the package substrate is not planar and has irregularities.

If the substrate 1 is ground and thinned from the side of the back surface 1b by a grinding apparatus, the device chips thinned to a predetermined thickness are obtained through division of the substrate 1. When grinding the substrate 1 from the side of the back surface 1b, a protective sheet 13 (see FIG. 3A) is applied beforehand on the side of the front surface 1a to protect the side of the front surface 1a. If the substrate 1 with the protective sheet 13 arranged on the front surface 1a is loaded into the grinding apparatus, the substrate 1 is appropriately supported on a support table 10 via the protective sheet 13.

Figure 2A:
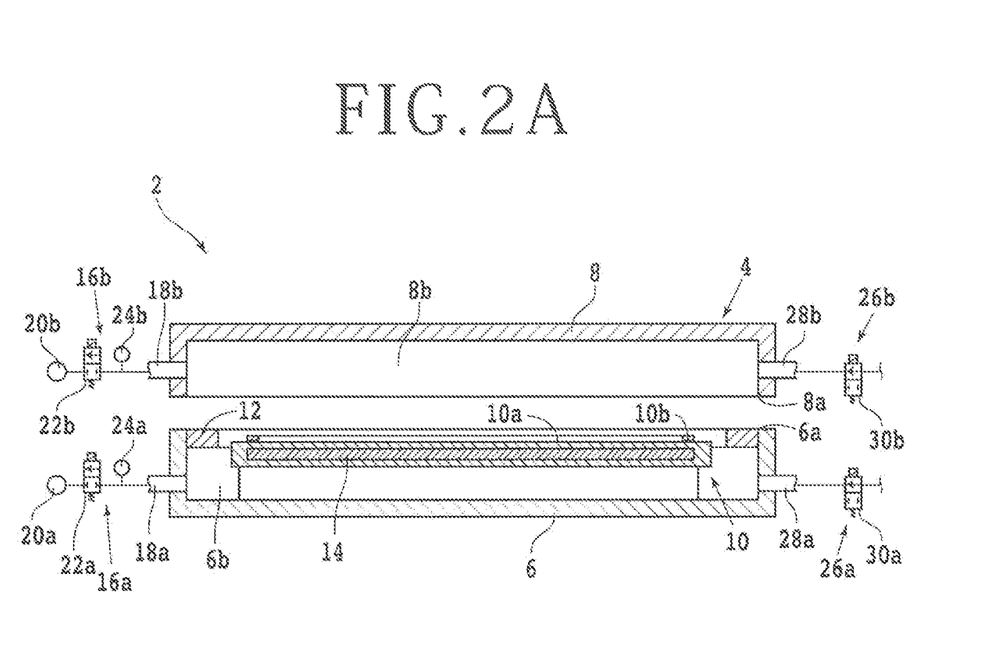
FIG. 2A is a cross-sectional view schematically illustrating a protective sheet application apparatus according to an embodiment of a first aspect of the present invention.

A description will next be made about a protective sheet application apparatus 2 according to the embodiment. FIG. 2A is a cross-sectional view schematically illustrating the protective sheet application apparatus 2. The protective sheet application apparatus 2 includes a vacuum chamber 4 which is separable into an upper housing 8 and a lower housing 6. For example, the upper housing 8 can be selectively raised or lowered. The lower housing 6 has an opening 6a, and the upper housing 8 has an opening 8a. These openings 6a and 8a have the same shape. If the upper housing 8 is lowered onto the lower housing 6 such that their openings 6a and 8a are registered with each other, a space that is shielded from an outside can be formed inside the upper housing 8 and the lower housing 6. The openings 6a and 8a of the lower and upper housings 6 and 8 are greater than the substrate 1, and therefore, the substrate 1 can be loaded in the space inside the vacuum chamber 4.

The lower housing 6 includes the support table 10 that supports the substrate 1 thereon. The support table 10 has an upper surface which is a planar support surface 10a for supporting the substrate 1. On the support surface 10a, a frame 10b of a diameter corresponding to that of the substrate 1 is fixed. The substrate 1 is placed on the support surface 10a in a region surrounded by the frame 10b. The support table 10 is set at a height such that, when the substrate 1 is mounted on the support surface 10a, the opening 6a of the lower housing 6 is at substantially the same height as or slightly higher than the front surface 1a of the substrate 1. As an alternative, the height of the support table 10 may be set such that the opening 6a of the lower housing 6 is higher than the front surface 1a of the substrate 1. Whichever the case may be, the protective sheet 13 hardly comes into close contact at an unnecessarily wide area thereof with a side surface 1c and the like of the substrate 1 when bringing the protective sheet 13 into close contact with the substrate 1 as will be described subsequently herein. Inside the lower housing 6, a protective sheet supporting portion 12 may be disposed to support, around the support table 10, the protective sheet 13 that is placed on the substrate 1 mounted on the support table 10. The protective sheet supporting portion 12 has an upper surface which is set at a height equal to or more than that of the front surface 1a of the substrate 1 mounted on the support table 10. If the protective sheet supporting portion 12 is disposed inside the lower housing 6, the protective sheet 13 becomes harder to come into close contact at an unnecessarily wide area thereof with the substrate 1.

A first depressurization unit 16a is connected to a side wall of the lower housing 6. As an alternative, the first depressurization unit 16a may be connected to a bottom wall of the lower housing 6. The first depressurization unit 16a includes a depressurization path 18a which is connected at an end thereof to the lower housing 6 and at an opposite end thereof to a suction source 20a. In the depressurization path 18a, an on-off valve 22a is disposed to switch the depressurization path 18a between a communicated state and a shut-off state. To the depressurization path 18a, an air pressure meter 24a is connected to enable a measurement of an air pressure in a space inside the lower housing 6. As an alternative, the air pressure meter 24a may be connected to the lower housing 6. On the other hand, a second depressurization unit 16b is connected to a side wall of the upper housing 8. As an alternative, the second depressurization unit 16b may be connected to a top wall of the upper housing 8. The second depressurization unit 16*b* includes a depressurization path 18*b* which is connected at an end thereof to the upper housing 8 and at an opposite end thereof to a suction source 20*b*. In the depressurization path 18*b*, an on-off valve 22*b* is disposed to switch the depressurization path 18*b* between a communicated state and a shut-off state. To the depressurization path 18*b*, an air pressure meter 24*b* is connected to enable a measurement of an air pressure in a space inside the upper housing 8. As an alternative, the air pressure meter 24*b* may be connected to the upper housing 8.

In addition, a first open-to-atmosphere unit 26*a* is connected to the side wall of the lower housing 6. As an alternative, the first open-to-atmosphere unit 26*a* may be connected to the bottom wall of the lower housing 6. The first open-to-atmosphere unit 26*a* includes an air supply path 28*a* which is connected at an end thereof to the lower housing 6 and at an opposite end thereof to the external atmosphere of the vacuum chamber 4. Further, in the air supply path 28*a*, an on-off valve 30*a* is disposed to switch the air supply path 28*a* between a communicated state and a shut-off state. On the other hand, a second open-to-atmosphere unit 26*b* is connected to the side wall of the upper housing 8. As an alternative, the second open-to-atmosphere unit 26*b* may be connected to the top wall of the upper housing 8. The second open-to-atmosphere unit 26*b* includes an air supply path 28*b* which is connected at an end thereof to the upper housing 8 and at an opposite end thereof to the external atmosphere of the vacuum chamber 4. Further, in the air supply path 28*b*, an on-off valve 30*b* is disposed to switch the air supply path 28*b* between a communicated state and a shut-off state.

A description will next be made about the protective sheet 13 to be applied on the front surface 1*a* of the substrate 1. The protective sheet 13 is a sheet that includes no adhesive layer. To the front surface 1*a* of the substrate 1 to be machined or processed by a grinding apparatus or the like, a protective tape with an adhesive layer included to protect the front surface 1*a* is bonded conventionally. If such a protective tape is bonded to the front surface 1*a* of the substrate 1 having irregularities such as bumps on the front surface 1*a*, however, portions of the adhesive layer may remain as residues on the front surface 1*a* when the protective tape is peeled off after completion of the machining or processing of the substrate 1. In the protective sheet application apparatus and method according to the embodiments, the protective sheet 13 that includes no adhesive layer is applied on the front surface 1*a* of the substrate 1 in place of a protective tape that includes an adhesive layer. As the protective sheet 13 has no adhesive layer, no residues of an adhesive layer remain on the substrate after peeling off the protective sheet 13 from the substrate.

The protective sheet 13 is a resin sheet that contains, for example, a polyolefin, polystyrene, or a polyester as a material. The polyolefin is a polymer synthesized by using an alkene as a monomer, and is, for example, polyethylene or polypropylene. The polyester is a polymer synthesized by using a dicarboxylic acid (a compound containing two carboxyl groups) and a diol (a compound containing two hydroxyl groups) as monomers, and is, for example, polyethylene terephthalate or polyethylene naphthalate. Since the protective sheet 13 has no adhesive layer, the protective sheet 13 cannot be applied as it is on the front surface 1*a* of the substrate 1, so that the substrate 1 with the protective sheet 13 cannot be formed. If the protective sheet 13 is heated to a temperature around its melting point and is then brought into contact with the front surface 1*a* of the substrate 1 while allowing the protective sheet 13 to soften, however, the protective sheet 13 can be brought into close contact with the front surface 1*a*, so that the protective sheet 13 can be fixedly applied on the substrate 1.

Inside the vacuum chamber 4 of the protective sheet application apparatus 2, a heating unit 14 is disposed to heat one of or both the protective sheet 13 and the substrate 1. For example, the heating unit 14 is disposed at a location close to the support surface 10*a* in the support table 10 and includes a heat source such as a resistance heating wire. As an alternative, the heating unit 14 may be a heat gun that can blow hot air and may be disposed on an inner wall of the lower housing 6 or the upper housing 8. As another alternative, the heating unit 14 may include infrared lamps that can irradiate infrared light to the protective sheet 13 and the like. Upon application of the protective sheet 13 onto the substrate 1 in the protective sheet application apparatus 2, the protective sheet 13 is held between the lower housing 6 and the upper housing 8 of the vacuum chamber 4 in the protective sheet application apparatus 2, and the space inside the vacuum chamber 4 is separated by the protective sheet 13 into a first compartment 6*b* and a second compartment 8*b* to be described subsequently herein. The protective sheet 13 is therefore dimensioned large enough to cover the opening 6*a* of the lower housing 6 and the opening 8*a* of the upper housing 8. For example, the protective sheet 13 is set to have a diameter greater than an inner diameter of the protective sheet supporting portion 12. As an alternative, the protective sheet 13 is set to have a diameter greater than the openings 6*a* and 8*a*.

If the protective sheet 13 is firmly kept in close contact with the front surface 1*a* of the substrate 1, a problem arises in that, when peeling off the protective sheet 13 from the substrate 1, the bumps 7 arranged on the front surface 1*a* of the substrate 1 are stripped off together with the protective sheet 13 from the substrate 1. If the close-contact force of the protective sheet 13 to the front surface 1*a* of the substrate 1 is weak, on the other hand, another problem arises in that grinding water and grinding debris penetrate between the protective sheet 13 and the substrate 1 while grinding the substrate 1. It is hence desired to control the close-contact force of the protective sheet 13 to the substrate 1 such that these problems do not arise. As will be described hereinafter, these problems do not arise with the protective sheet application apparatus and method according to the embodiments because the protective sheet 13 can be kept in close contact with the substrate 1 by a controlled desired force.

Figure 6:
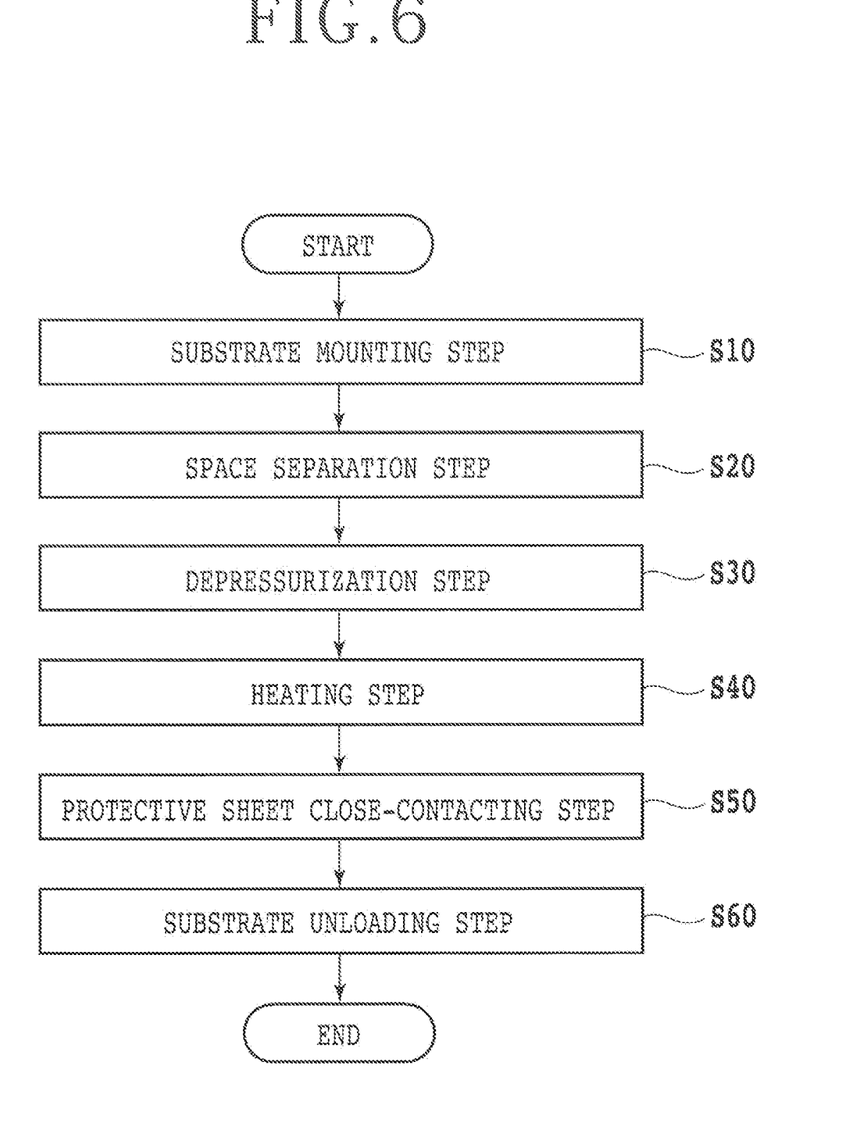
FIG. 6 is a flow chart schematically illustrating a flow of the individual steps in the protective sheet application method.

A description will next be made about the protective sheet application method according to the embodiment that brings the protective sheet 13 into close contact with the front surface 1*a* of the substrate 1 by using the protective sheet application apparatus 2. FIG. 6 is a flow chart schematically illustrating a flow of individual steps in the protective sheet application method according to the embodiment.

Figure 2B:
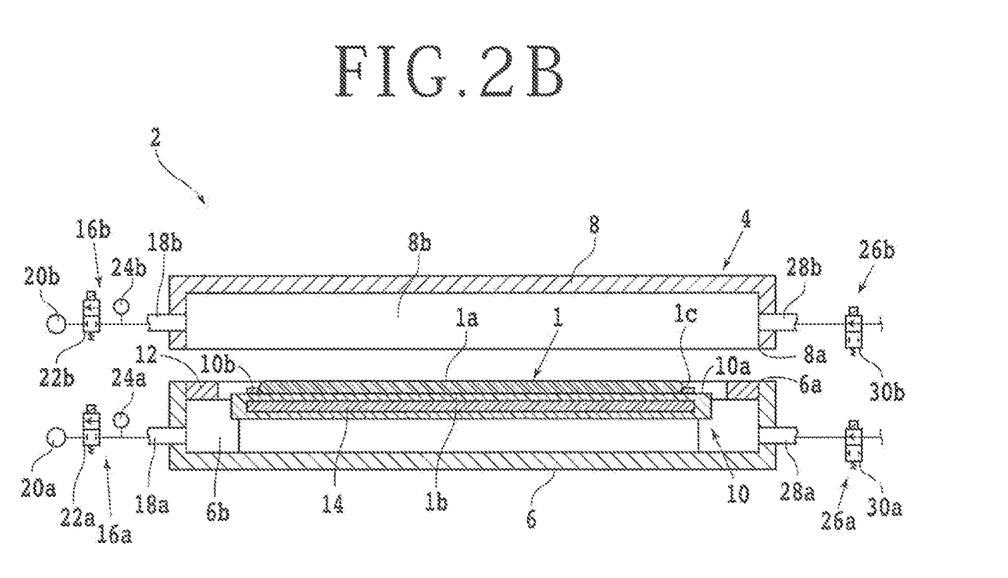
FIG. 2B is a cross-sectional view schematically illustrating a substrate mounting step in a protective sheet application method according to an embodiment of a second aspect of the present invention.

In the protective sheet application method according to the embodiment, a substrate mounting step S10 is first performed to mount the substrate 1 on the support table 10. FIG. 2B is a cross-sectional view schematically illustrating the substrate mounting step S10. In the substrate mounting step S10, the substrate 1 is mounted on the support surface 10*a* of the support table 10 with the lower housing 6 and the upper housing 8 of the vacuum chamber 4 being separated from each other. At this time, the substrate 1 is kept directed upward on the side of the front surface 1*a* and is kept directed toward the support surface 10*a* of the support table 10 on the side of the back surface 1*b*. Here, it is desired to adjust the height of the support table 10 beforehand such that the front surface 1a of the substrate 1 has a height position equal to or lower than that of an upper end of the lower housing 6 when the substrate 1 is mounted on the support surface 10a of the support table 10. However, the protective sheet application method according to the embodiment is not limited to the above-described height position of the front surface 1a of the substrate 1, and the height position of the front surface 1a of the substrate 1 may exceed that of the upper end of the lower housing 6 when the substrate 1 is mounted on the support surface 10a of the support table 10.

Figure 3A:
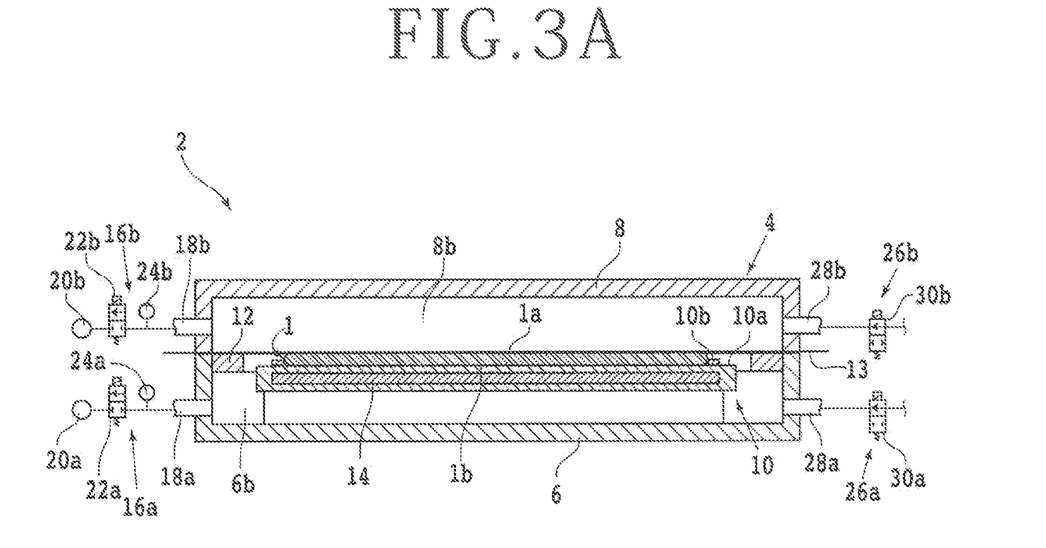
FIG. 3A is a cross-sectional view schematically illustrating a space separation step in the protective sheet application method.

After performing the substrate mounting step S10, the protective sheet 13 is held between the lower housing 6 and the upper housing 8, and a space separation step S20 is performed to separate the space inside the vacuum chamber 4 by the protective sheet 13. FIG. 3A is a cross-sectional view schematically illustrating the space separation step S20.

In the space separation step S20, the protective sheet 13 is first placed on the substrate 1 and the lower housing 6 in opposition to the front surface 1a of the substrate 1 mounted on the support table 10 such that the opening 6a of the lower housing 6 is covered by the protective sheet 13. At this time, the protective sheet 13 is supported on the protective sheet supporting portion 12 in a region that is on an outer side of the front surface 1a of the substrate 1 and on an inner side of the opening 6a. Therefore, the protective sheet 13 hardly hangs down into the space inside the lower housing 6 and hardly comes into contact with the side surface 1c of the substrate 1. It is hence possible to prevent the protective sheet 13 from coming into close contact at an unnecessarily wide area thereof with the substrate 1 when applying the protective sheet 13 onto the substrate 1. In the space separation step S20, the lower housing 6 and the upper housing 8 are next brought closer to each other, and the lower housing 6 and the upper housing 8 are unified with the protective sheet 13 held between the lower housing 6 and the upper housing 8. The space in the vacuum chamber 4 is then separated into the first compartment 6b surrounded by the lower housing 6 and the protective sheet 13 and the second compartment 8b surrounded by the upper housing 8 and the protective sheet 13.

Figure 3B:
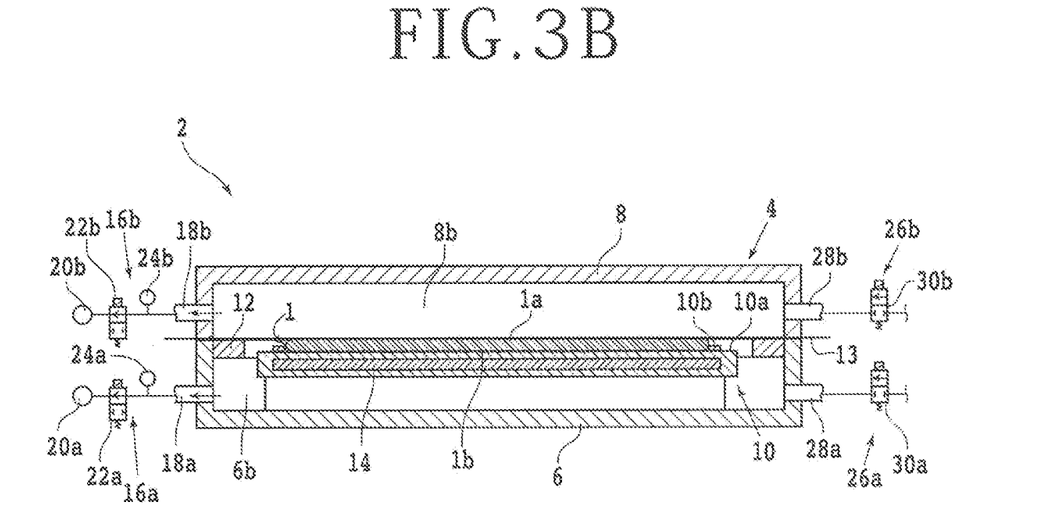
FIG. 3B is a cross-sectional view schematically illustrating a depressurization step in the protective sheet application method.

After performing the space separation step S20, a depressurization step S30 is performed. FIG. 3B is a cross-sectional view schematically illustrating the depressurizing step S30. In the depressurization step S30, the first compartment 6b is depressurized to a predetermined air pressure by the first depressurization unit 16a, and at the same time, the second compartment 8b is depressurized by the second depressurization unit 16b. When depressurizing the first compartment 6b, the on-off valve 22a is operated to connect the suction source 20a and the first compartment 6b via the depressurization path 18a. When depressurizing the second compartment 8b, on the other hand, the on-off valve 22b is operated to connect the suction source 20b and the second compartment 8b via the depressurization path 18b. When depressurizing the first compartment 6b and the second compartment 8b, the air pressure in the first compartment 6b is monitored by the air pressure meter 24a, and at the same time, the air pressure in the second compartment 8b is monitored by the air pressure meter 24b. Then, the air pressure in the first compartment 6b is lowered to the predetermined air pressure, and at the same time, the air pressure in the second compartment 8b is lowered to an air pressure corresponding to the predetermined air pressure. Here, the air pressure in the first compartment 6b may preferably be approximately equal to or lower than that in the second compartment 8b. If the air pressure in the first compartment 6b is significantly higher than that in the second compartment 8b, the protective sheet 13 expands toward the second compartment 8b and may separate from the front surface 1a of the substrate 1.

Figure 4A:
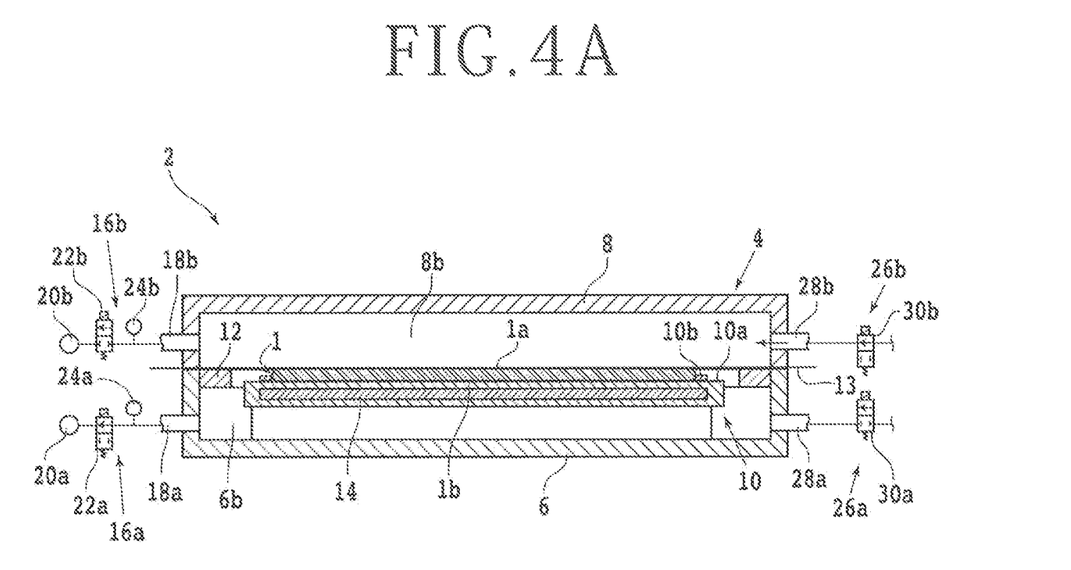
FIG. 4A is a cross-sectional view schematically illustrating a protective sheet close-contacting step in the protective sheet application method.

After performing the depressurization step S30, a protective sheet close-contacting step S50 is performed to open the depressurized second compartment 8b to the atmosphere by the second open-to-atmosphere unit 26b, so that the protective sheet 13 is brought into close contact with the substrate 1 such that the protective sheet 13 follows the irregularities on the front surface 1a of the substrate 1. FIG. 4A is a cross-sectional view schematically illustrating the protective sheet close-contacting step S50. In the protective sheet close-contacting step S50, the on-off valve 22b of the second depressurization unit 16b is controlled beforehand to keep the depressurization path 18b shut-off. The on-off valve 30b of the second open-to-atmosphere unit 26b is then controlled to connect the second compartment 8b and the external atmosphere of the vacuum chamber 4 to each other, so that the air pressure in the second compartment 8b is allowed to return to the atmospheric pressure. At this time, as the rise of the air pressure in the second compartment 8b is steeper, the protective sheet 13 can evenly be brought into close contact with the front surface 1a of the substrate 1.

The degree of close-contact force of the protective sheet 13 which is brought into close contact with the front surface 1a of the substrate 1, depends on a difference between the air pressure (the atmospheric pressure) in the second compartment 8b which is raised to the atmospheric pressure in the protective sheet close-contacting step S50 and the air pressure in the first compartment 6b which has been depressurized by the first depressurization unit 16a. Therefore, the air pressure in the second compartment 8b acts as one of factors that determine the degree of close-contact force of the protective sheet 13. In the protective sheet application method according to the embodiment, the air pressure in the second compartment 8b, which is to be depressurized in the depressurization step S30, is therefore controlled to the predetermined air pressure such that the protective sheet 13 produces an appropriate degree of close-contact force to the substrate 1. The close-contact force of the protective sheet 13 to the substrate 1 can be set to a predetermined degree by maintaining the second compartment 8b at the predetermined air pressure. Therefore, the close-contact force of the protective sheet 13 can be controlled by controlling the air pressure in the second compartment 8b.

The predetermined air pressure is set, for example, such that the close-contact force of the protective sheet 13 kept in close contact with the substrate 1 is of such a degree of force as to prevent the bumps 7 from being stripped off together with the protective sheet 13 from the front surface 1a when the protective sheet 13 is peeled off from the substrate 1. Further, the predetermined air pressure is also set, for example, such that the close-contact force of the protective sheet 13 kept in close contact with the substrate 1 is of such a degree of force as to prevent the occurrence of a gap between the substrate 1 and the protective sheet 13 and the penetration of machining debris and machining water into the gap while machining the substrate 1.

Figure 5A:
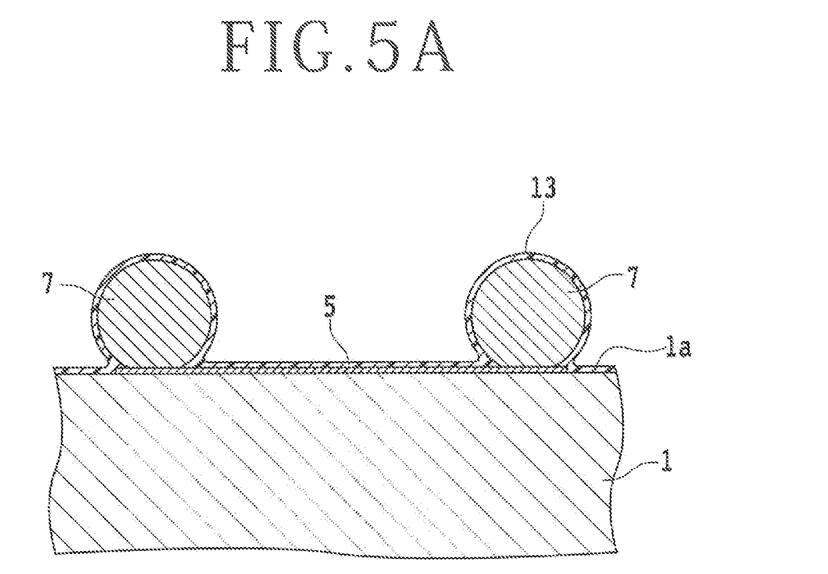
FIG. 5A is a fragmentary cross-sectional view schematically illustrating a protective sheet that is firmly in close contact with a front surface of the substrate by a strong force.
Figure 5B:
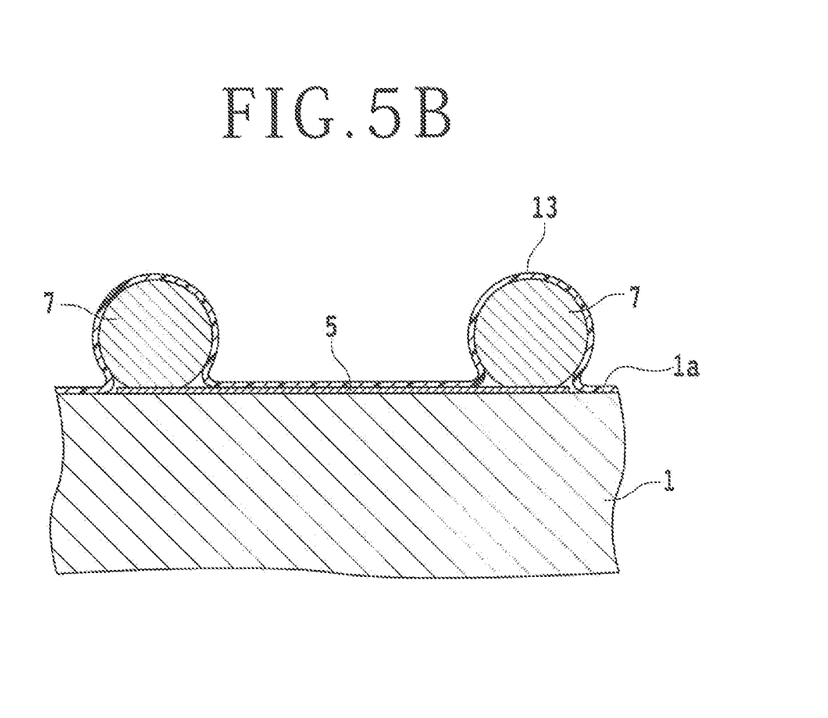
FIG. 5B is a fragmentary cross-sectional view schematically illustrating the protective sheet that is in close contact with the front surface of the substrate by a weak force.

FIGS. 5A and 5B are fragmentary cross-sectional views each schematically illustrating, on an enlarged scale, the protective sheet 13 applied on the front surface 1a of the substrate 1. FIG. 5A schematically illustrates a state in which the protective sheet 13 is applied on the front surface 1a of the substrate 1 by a relatively strong close-contact force, while FIG. 5B schematically illustrates a state in which the protective sheet 13 is applied on the front surface 1a of the substrate 1 by a relatively weak close-contact force. The appropriate degree of close-contact force of the protective sheet 13 to the substrate 1 depends, for example, on various factors such as the shape of irregularities formed on the front surface 1a of the substrate 1, the physical properties of members exposed to the front surface 1a, the physical properties of the protective sheet 13, and the thicknesses and hardness of the substrate 1 and the protective sheet 13. Accordingly, it is preferred to make search beforehand for the air pressure in the first compartment 6b which can provide a most appropriate close-contact force, by providing substrates 1 and protective sheets 13 and then carrying out a test to bring the protective sheets 13 into close contact with the respective substrates 1 under varied pressures in the first compartment 6b and to check the resulting close-contact forces.

In the protective sheet application apparatus and method according to the embodiments, the protective sheet 13 can be applied on the substrate 1 by the predetermined degree of close-contact force by controlling the air pressure in the first compartment 6b to the predetermined air pressure in the depressurization step S30. The air pressure in the first compartment 6b is therefore controlled to control the close-contact force of the protective sheet 13 to the substrate 1, so that the protective sheet 13 is appropriately applied on the substrate 1.

After the space separation step S20 but before a substrate unloading step S60 to be described subsequently herein, a heating step S40 is performed to heat one of or both the protective sheet 13 and the substrate 1. In the heating step S40, with the protective sheet 13 kept in contact with the front surface 1a of the substrate 1, for example, the heating unit 14 is operated to heat the substrate 1 together with the protective sheet 13 such that the protective sheet 13 is softened. Here, the heating temperature for the substrate 1 and the protective sheet 13 is preferably set at a temperature around the melting point of the protective sheet 13.

In the protective sheet application apparatus and method according to the embodiments, the protective sheet 13 is brought into close contact with the front surface 1a of the substrate 1 by pressing the protective sheet 13 against the front surface 1a of the substrate 1 by a predetermined force with the protective sheet 13 heated at a predetermined temperature. As an alternative, the protective sheet 13 may be heated at the predetermined temperature with the protective sheet 13 pressed against the front surface 1a of the substrate 1 by the predetermined force such that the protective sheet 13 is brought into close contact with the front surface 1a of the substrate 1. As another alternative, the substrate 1 may be heated with the substrate 1 and the protective sheet 13 kept separated from each other, and heat may be conducted from the substrate 1 to the protective sheet 13 concurrently with pressing the protective sheet 13 against the substrate 1 by a predetermined force while maintaining the protective sheet 13 in contact with the substrate 1. Preferably, the heating step S40 is performed after the space separation step S20 but before the protective sheet close-contacting step S50. More preferably, the heating step S40 is performed after the depressurization step S30 but before the protective sheet close-contacting step S50.

Figure 4B:
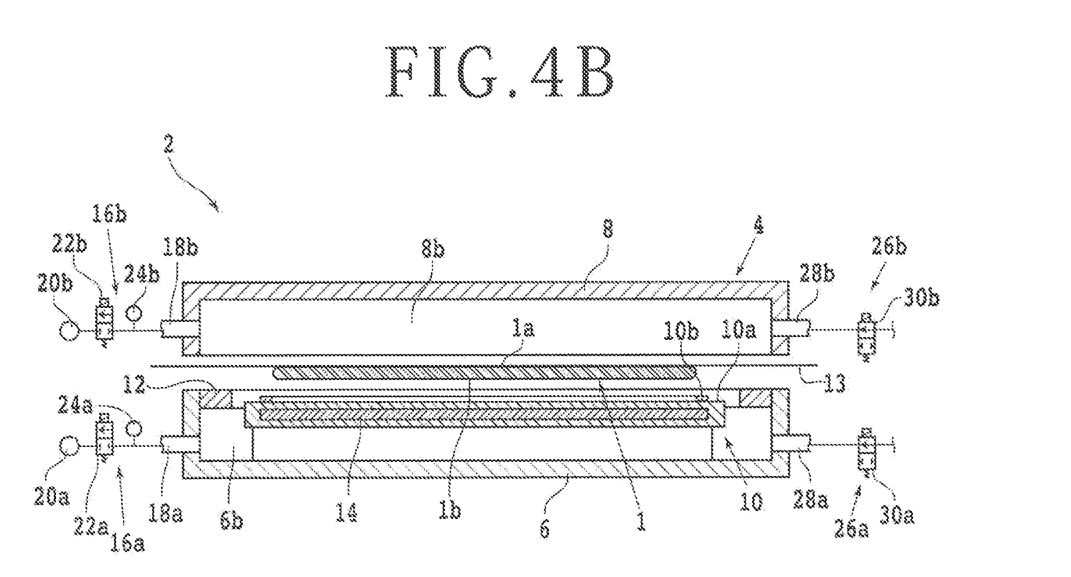
FIG. 4B is a cross-sectional view schematically illustrating a substrate unloading step in the protective sheet application method.

In the protective sheet application method according to the embodiment, the substrate unloading step S60 is performed after the protective sheet close-contacting step S50. FIG. 4B is a cross-sectional view schematically illustrating the substrate unloading step S60. In the substrate unloading step S60, the depressurized first compartment 6b is opened to the atmosphere by the first open-to-atmosphere unit 26a to separate the lower housing 6 and the upper housing 8 from each other, and the substrate 1 with the protective sheet 13 kept in close contact therewith is unloaded from the vacuum chamber 4. When opening the depressurized first compartment 6b to the atmosphere by the first open-to-atmosphere unit 26a, the on-off valve 22a of the first depressurization unit 16a is operated beforehand to keep the depressurization path 18a shut-off. The on-off valve 30a of the first open-to-atmosphere unit 26a is then operated to connect the first compartment 6b and the external atmosphere of the vacuum chamber 4 together, so that the air pressure in the first compartment 6b is allowed to return to the atmospheric pressure. Both the air pressure in the first compartment 6b and the air pressure in the second compartment 8b then rise to the atmospheric pressure, so that the lower housing 6 and the upper housing 8 can be separated from each other.

If the lower housing 6 and the upper housing 8 are separated from each other, the substrate 1 with the protective sheet 13 can be unloaded from the vacuum chamber 4. Subsequently, a surplus region cutting-off step may be performed to cut off the protective sheet 13 at a portion thereof on an outer side of the side surface 1c of the substrate 1 by a cutting unit such as a cutter. Subsequently, a machining step may be performed to apply machining such as grinding to the side of the back surface 1b of the substrate 1 with the protective sheet 13 applied on the front surface 1a thereof. A peeling step may then be performed to peel off the protective sheet 13 from the front surface 1a of the machined substrate 1.

According to the protective sheet application apparatus and method of the embodiments, the protective sheet 13 can be applied onto the front surface 1a of the substrate 1 by a controlled close-contact force. The close-contact force can therefore be controlled to prevent the occurrence of a problem such as the stripping off of the bumps 7 formed on the front surface 1a when the protective sheet 13 is peeled off from the substrate 1.

The present invention is not limited to the description of the above embodiments and can be carried out with various modifications. In the embodiments described above, the description has been made, for example, about the case in which the protective sheet 13 is applied on the front surface 1a of the substrate 1 having irregularities on the side of the front surface 1a. However, the protective sheet application apparatus and method according to the first and second aspects of the present invention are not limited to the above-mentioned case. Described specifically, the protective sheet 13 may be applied on the back surface 1b of the substrate 1. Further, irregularities such as the bumps 7 may not be disposed or the devices 5 may not be disposed on the front surface 1a on which the protective sheet 13 is applied.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A protective sheet application apparatus for applying a protective sheet on a front surface of a substrate having irregularities on a side of the front surface, comprising:
   a vacuum chamber separable into an upper housing and a lower housing;
   a support table disposed inside the lower housing and configured to mount the substrate thereon;
   a first depressurization unit connected to the lower housing;

a first open-to-atmosphere unit connected to the lower housing;

a second depressurization unit connected to the upper housing; and a second open-to-atmosphere unit connected to the upper housing, wherein the first depressurization unit is configured to depressurize a first compartment in the vacuum chamber to a predetermined air pressure, the first compartment being surrounded by the protective sheet and the lower housing, the protective sheet being placed on the substrate mounted on the support table and being held between the upper housing and the lower housing, the second depressurization unit is configured to depressurize a second compartment in the vacuum chamber, the second compartment being surrounded by the protective sheet and the upper housing, the protective sheet being placed on the substrate mounted on the support table and being held between the upper housing and the lower housing, the second open-to-atmosphere unit opens the depressurized second compartment to the atmosphere, so that the protective sheet is brought into close contact with the front surface of the substrate by a predetermined force, and after opening the second compartment to the atmosphere by the second open-to-atmosphere unit, the first open-to-atmosphere unit opens the first compartment to the atmosphere to separate the upper housing and the lower housing of the vacuum chamber from each other, so that the substrate with the protective sheet kept in close contact therewith is unloaded from the vacuum chamber.

2. The protective sheet application apparatus according to claim 1, further comprising:

a protective sheet supporting portion configured to support the protective sheet that is placed on the substrate mounted on the support table, at a periphery of the support table.

3. The protective sheet application apparatus according to claim 1, further comprising:

a heating unit configured to heat one of or both the protective sheet and the substrate.

4. A protective sheet application method for applying a protective sheet on a front surface of a substrate having irregularities on a side of the front surface, comprising:

a substrate mounting step of mounting, in a vacuum chamber that is separable into an upper housing and a lower housing and includes a support table disposed inside the lower housing and configured to mount the substrate thereon, a first depressurization unit and a first open-to-atmosphere unit connected to the lower housing, and a second depressurization unit and a second open-to-atmosphere unit connected to the upper housing, the substrate onto the support table with the front surface directed upward in a state that the lower housing and the upper housing are separated from each other;

a space separation step of placing the protective sheet on the substrate and the lower housing with the protective sheet opposing the front surface of the substrate mounted on the support table, and unifying the lower housing and the upper housing with the protective sheet held between the lower housing and the upper housing, so that a space in the vacuum chamber is separated into a first compartment surrounded by the lower housing and the protective sheet and a second compartment surrounded by the upper housing and the protective sheet;

a depressurization step of depressurizing the first compartment to a predetermined air pressure by the first depressurization unit and depressurizing the second compartment by the second depressurization unit;

a protective sheet close-contacting step of opening the depressurized second compartment to the atmosphere by the second open-to-atmosphere unit to bring the protective sheet into close contact with the substrate by a predetermined force such that the substrate follows the irregularities of the front surface of the substrate; and a substrate unloading step of, after the protective sheet close-contacting step, opening the pressurized first compartment to the atmosphere by the first open-to-atmosphere unit to separate the lower housing and the upper housing from each other, and unloading the substrate with the protective sheet kept in close contact therewith from the vacuum chamber.

5. The protective sheet application method according to claim 4, wherein the protective sheet is a resin sheet containing a polyolefin, polystyrene, or a polyester.

6. The protective sheet application method according to claim 4, further comprising:

a heating step of heating one of or both the protective sheet and the substrate, after the space separation step but before the substrate unloading step.

* * * * *